United States Patent [19]
Lemoine et al.

[11] 4,024,629
[45] May 24, 1977

[54] FABRICATION TECHNIQUES FOR MULTILAYER CERAMIC MODULES

[75] Inventors: Jean Marie Lemoine, St. Michel sur Orge, France; Jean Luc Mathis, Fishkill, N.Y.

[73] Assignee: International Business Machines Corporation, Armonk, N.Y.

[22] Filed: Nov. 26, 1975

[21] Appl. No.: 635,567

[30] Foreign Application Priority Data

Dec. 31, 1974 France .............................. 74.43622

[52] U.S. Cl. .................................. 29/625; 29/420; 174/68.5; 427/97
[51] Int. Cl.² ......................................... B41M 3/08
[58] Field of Search ......... 29/624, 625, 420, 402.5, 29/418, 419, 530, 527.1, 527.2, 527.5; 174/68.5; 427/96, 97, 123, 126, 331, 352, 372, 383, 154, 155, 156, 207, 229, 243, 247, 256, 271, 272, 282, 287, 288; 317/101 B

[56] References Cited
UNITED STATES PATENTS

| | | | |
|---|---|---|---|
| 3,518,756 | 7/1970 | Bennett et al. ...................... | 29/625 |
| 3,770,529 | 11/1973 | Anderson ...................... | 174/68.5 X |
| 3,838,204 | 9/1974 | Ahn et al. ......................... | 174/68.5 |
| 3,948,706 | 4/1976 | Schmeckenbecher ........... | 29/625 X |

OTHER PUBLICATIONS

B509,772, Mar. 1976, Chirino et al., 174/68.5.
IBM Technical Disclosure Bulletin, vol. 16, No. 5, Oct. 1973, p. 1497.
IBM Technical Disclosure Bulletin, vol. 16, No. 1, June 1973, pp. 243, 242.
IBM Technical Disclosure Bulletin, vol. 11, No. 9, Feb. 1969, p. 1111.

*Primary Examiner*—James R. Duzan
*Attorney, Agent, or Firm*—David M. Bunnell

[57] ABSTRACT

Metallized through-holes are provided in insulating substrates by placing the substrate onto an absorbant carrier and screening a metallization paste, which contains a metal component dispersed in an organic solvent, into the holes. The carrier absorbs the solvent and a portion of the paste adheres to the carrier. When the carrier is stripped from the substrate it carries with it the center portion of the paste to leave a thin layer of paste on the inner surface of the substrate.

11 Claims, 8 Drawing Figures

FABRICATION TECHNIQUES FOR MULTILAYER CERAMIC MODULES

BACKGROUND OF THE INVENTION

This invention relates to improvements in fabrication techniques for multilayer ceramic modules and, more particularly, to the metallization step of the through-holes punched in unfired ceramic sheets. It should be noted that the term "sheet" as used herein implies no limitation and that the method of the present invention also applies to automatized applications wherein unfired ceramic films or strips are continuously fed from a supply reel.

At the present time, unfired ceramic sheets are widely used in the microelectronics field and have played a significant part in the development of that industry. In one of the more common applications, the unfired ceramic sheet, after it has been subjected to suitable processing, is used as an insulating substrate onto which semiconductor chips may subsequently be deposited. It has been found that the ceramic materials involved exhibited all required properties, notably a high resistivity and a high mechanical strength.

Small size ceramic modules were initially used. These were provided on either or both of their main faces, using the silk-screening technique, with conductive metal patterns that served to electrically connect the active and/or passive components located on the module to the connection pins thereof and to external circuitry.

The significant advances subsequently made in the semiconductor industry to meet microminiaturization demands have made it possible to achieve high packing densities of components. For example, several hundreds, and possibly thousands, of transistors, diodes, resistors, etc., can be accommodated on a semiconductor chip having an area of the order of a few square millimeters. These advances have created a need for an insulating substrate such that the packing density of the conductive metal patterns referred to above would be very high.

The most promising solution to this problem is a well-known technique that relies upon the use of ceramics to provide multilayer circuit modules. These modules, the manufacturing steps of which are outlined hereafter, are multilayer ceramic structures each of which comprises a pattern of conductive metal lines and electric means for interconnecting the individual levels. These multilayer microelectronic ceramic structures are manufactured as follows: the first procedural step is to blend the raw components of the various ceramic bodies, in particulate form, and an organic vehicle, using, for example, a ball mill, to provide a viscous fluid commonly referred to as "paint." The latter is then deposited, utilizing a doctor blade or other well-known technique, onto a substrate to form a thin ceramic film adhering thereto. Generally, the doctor blade is stationary while the substrate is moving. The latter may consist, for instance, of a strip of plastic material such as polytetrafluorethylene (Teflon, DuPont de Nemours Reg. TM) or polyethylene tetraphtalate (Mylar, DuPont de Nemours Reg. TM), or of a web of stainless steel. The viscous fluid flows between the substrate and the blade to assume a constant, predetermined thickness. The resultant film is then dried at a drying station and stripped from its substrate. The thickness, porosity and other physical and electrical characteristics of the film are then checked. Additionally, the film is inspected to determine the presence of any cracks, blisters and other defects. Before it is used, the ceramic film is usually stored for some time in a suitable storage station to allow the remaining volatile components to evaporate. At this stage, the thin ceramic film is unfired, has a constant thickness, is free from the above-mentioned defects, and its external appearance is that of a plastified sheet. The film is then blanked into sheets of appropriate dimensions using standard techniques.

Through-holes are then punched at predetermined locations in the individual unfired ("green") sheets. A conductive paste is deposited by silk-screening or other equivalent technique on the surface of the sheets, to form the desired metallizations, and into the through-holes. This paste usually consists of powdered molybdenum, a glass frit and an organic vehicle essentially comprised of a binder and a solvent. The sheets are then aligned and stacked together in such a way that corresponding through-holes in different sheets are all located on the same vertical axis. The assembly is then laminated to provide good intersheet bonding through a softening of the resin binder. The lamination is perfomed at relatively low temperature and pressure. The laminated sheets are then sintered at a temperature that will allow the ceramic to densify, thereby eliminating the organic components and converting the conductive patterns formed as described above to the metal state. The resultant monolithic structure is then provided with connection pins or contact pads as well as with semiconductor chips.

One of the problems which arise during fabrication of multilayer ceramic structures is the metallization of the through-holes. These holes are punched in the green sheet using standard techniques and have a very small size, their diameter being of the order of 0.1 millimeter, so that they are extremely difficult to metallize. A standard process consists in mounting a silk-screening mask such as a molybdenum mask on the green ceramic sheet in which through-holes have been punched, the sheet itself being placed on a flat, stable carrier, and in forcing a metallization composition in particulate or paste form through the mask, using a doctor blade, so as to fill the holes and simultaneously form the desired metallization pattern on the surface of the green sheet. A similar method entitled "Vacuum Operated Silk Screening Technique" is described in IBM Technical Disclosure Bulletin, Vol. 16, No. 5, October 1973, page 1497. However, it would be desirable, instead of completely filling the holes as in the case of these prior art techniques, to achieve a partial metallization thereof, that is, to deposit a thin metallization layer on their inner surface, so as to leave a free space which could subsequently be filled by capillarity with a high conductivity metal such as copper, or, alternatively, accommodate a connection pin, as shall be seen hereafter.

Accordingly, it is an object of the present invention to overcome the disadvantages of the prior art and to provide a method of metallizing the through-holes punched in a green ceramic sheet, said method being characterized in that it enables a uniform, thin metallization layer to be deposited on the inner surface of each hole.

Another object of the invention is to provide green ceramic sheets comprising through-holes the inner surface of which is coated with a thin metallization layer and which can be filled by capillarity, after said sheets have been stacked together and laminated, with a metal such as copper.

Still another object of the invention is to provide a method of mounting connection pins into the through-holes of green ceramic sheets wherein the inner surface of said holes is coated with a thin metallization layer.

Yet another object of the invention is to provide a method of mounting connection pins into the through-holes punched in a green ceramic sheet and the inner surface of which is coated with a thin metallization layer, said method being characterized in that it can readily be automatized where said pins are cylindrical.

These and other objects are attained using the teachings of the present invention.

BRIEF SUMMARY OF THE INVENTION

A preferred embodiment of the invention includes the steps of forming a green ceramic sheet, punching therein a desired pattern of through-holes, forming by silk-screening a desired metallization pattern and simultaneously filling said holes by doctor blading through a mask with the same metallization paste. The latter step is carried out by placing the punched ceramic sheet onto a carrier capable of absorbing the solvent contained in said paste so that, when the sheet is stripped from its carrier, the center part of the paste which fills the holes is removed therefrom along with the carrier. This leaves a thin metallization layer on the inner surface of the holes due to the fact the ceramic sheet also absorbs the solvent.

The foregoing and other objects, characteristics and advantages of the invention will be apparent from the following more particular description of a preferred embodiment of the invention, as illustrated in the accompanying drawings.

DETAILED DESCRIPTION

A number of well-known methods can be utilized to fabricate the green ceramic sheet that forms the basic material used in connection with the present invention. Briefly, a ceramic composition (also called "slip casting composition") is cast by doctor blading onto a moving substrate consisting of a thin resilient ribbon generally comprised by Mylar or Teflon polymer film, the thickness of the film of ceramic material being defined by the space between the blade and the substrate. The slip casting composition may consist, for example, of a ceramic material essentially comprised of alumina powder in an organic binder generally comprising a solvent (toluene), a humidifier such as Tergitol (Union Carbide Reg. TM), a plastifier (dibutyl phthalate) and a resin (polyvinyl butyral). All of these ingredients are finely blended to provide a homogeneous suspension. The ceramic film is then dried, stripped from its substrate and allowed to rest for some time to enable all volatile components to evaporate. The green ceramic film is then blanked into sheets of desired dimensions which can be subjected to further processing. The green ceramic sheets are stable and exhibit uniform characteristics. Alternatively, the green ceramic film can be formed utilizing the well-known calendering technique, which is slightly different from the one just described. Vertical through-holes are then punched in the sheets at predetermined locations to subsequently provide electric interconnections between the metallization patterns in the various layers. A suitable punching method entitled "Mechanical Programmed Punching" is described in IBM Technical Disclosure Bulletin, Vol. 11, No. 9, February 1969, page 1111. Another suitable punching method is disclosed in U.S. Pat. No. 3,518,756 (IBM). A conductive metallization paste is then deposited by silk-screening through a molybdenum mask. This is an important step and it is essential that all through-holes be metallized. Considering the small size of these holes, it is clear that the filling technique utilized must be both practical and reliable.

Figure 1A:
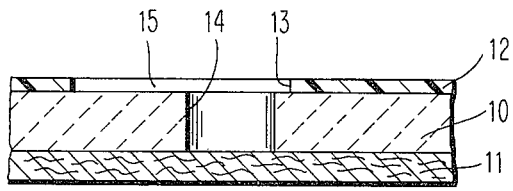
FIGS. 1A–1D illustrate the method of partially metallizing the through-holes punched in a green ceramic sheet, in accordance with the invention.
Figure 1B:
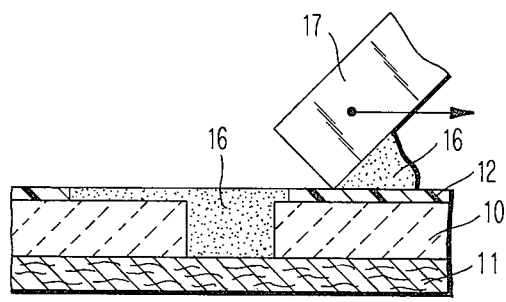

Referring now to FIG. 1A, there is depicted a green ceramic sheet 10 held into place on a carrier 11 by means not shown. Overlying the sheet is a molybdenum mask 12 comprising a number of openings through which the conductive paste can be forced. One such opening, 13, serves both to fill a hole 14 punched in the ceramic sheet (the diameter of the hole being in the range of 0.1 – 1mm) and to deposit a portion 15 of the conductive pattern intended to provide electric interconnections between different holes and/or components on the sheet. The conductive paste may be a mixture of metal particles and a binder; a typical paste would consist, on the one hand, of an inorganic portion comprising 70% of small molybdenum particles (diameter: 2 to 5 microns) and 30% of a glass frit (comprised, for example, of $Al_2O_3$ 42%, $SiO_2$ 54%, CaO 2%, and MgO 2%, and on the other hand, of an organic portion, referred to hereafter as vehicle, comprised of a mixture of butyl carbitol acetate (which acts as a solvent), 75%, cellulose ethyl Type N50 (which is the binder proper), 20%, and Sarkosyl, 5% which is an N-acylated sarcosine, all of which proportions will be familar to those skilled in the art. The viscosity of the paste is about 32,000 cps. Such a paste, labeled 16 in FIG. 1B, is applied onto the mask 12 using a Teflon polymer blade 17 and is forced through the openings of the mask. The amount of pressure must be carefully controlled to prevent damage to the mask or the ceramic sheet. The carrier 11 must be capable of absorbing the solvent contained in the conductive paste. Generally, any porous carrier used with the above paste composition will be suitable; for example, paper would be an adequate carrier. Where the holes are deep and narrow, pastes exhibiting lower viscosities should be used. In the prior art, the use of such pastes often resulted in an insufficient amount of metal being deposited in the holes; this problem does not arise here since the carrier 11 absorbs the solvent and causes a portion of the paste to adhere thereto.

Figure 1C:
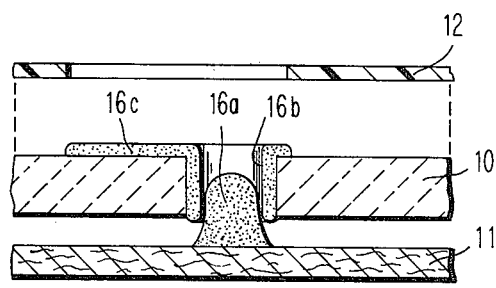
Figure 1D:
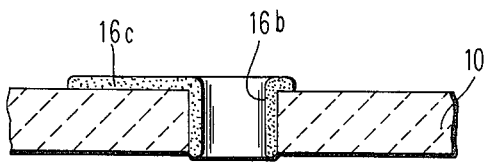

All that remains to be done at this stage is to remove the mask 12 and strip the green ceramic sheet from its carrier, as shown in FIG. 1C. As the latter operation is performed, a portion 16a of the paste that fills the hole 14 is removed, leaving a thin layer of paste (shown at 16b in FIG. 1C) on the inner surface of the hole. Portion 16c corresponds to portion 15 of the conductive pattern. The resultant structure is shown in FIG. 1D.

If more than one level is required, several of these sheets are metallized in the manner described above, stacked together in such a way as to ensure that all through-holes are perfectly aligned, and finally laminated at sufficient pressure and temperature to cause the binder to evaporate and provide good intersheet bonding. A monolithic structure is thus obtained which is then sintered at the temperature required to fire the ceramic, thereby eliminating the organic components of the paste and converting the conductive patterns to the metal state. A detailed description of a technique which can generally be used to form a monolithic structure is provided in the previously mentioned U.S. Pat. No. 3,518,756 to which the teachings of the present invention could readily be applied; this would essentially involve adding to silk-screening stations 34–36 suitable means for continuously feeding a solvent-absorbing carrier such that the silk-screening operation and the filling of the through-holes could be effected simultaneously.

Some of the metallization pastes, notably those comprising a mixture of refractory and/or noble metals and a suitable carrier, that were used in the prior art to fill the through-holes resulted in the conductivity of the latter being unsatisfactory due to the porosity of the paste, making it necessary to fill with copper the capillary paths formed within the holes, usually by immersing the monolithic structure in a bath of molten copper. This method of improving the conductivity of the metal conductors is well known (see, for example, the article entitled "Boat for Multilayer Circuit Module Capillary Filling" in IBM Technical Disclosure Bulletin, Vol. 15, No. 7, December 1972, page 2140, and also the technique disclosed in U.S. Pat. No. 3,838,204 to IBM). However, the discontinuities that often exist in such conventional pastes result in the through-holes being filled with copper in an irregular manner. Since some modules comprise several hundreds of through-holes, high yields can hardly be achieved using such prior art solutions. One advantage of the present invention is that, because they are lined with a thin layer of metal, the through-holes in the stacked layers of the monolithic structure are easier to fill with copper.

Another substantial advantage of the invention is that it provides a method of mounting connection pins into the partially metallized cavities formed in green ceramic sheets.

Such pins are required in order to provide electric connections with external circuitry and are generally attached to the monolithic structure after sintering of the latter. One prior art technique consists in forming a metal "abutment" in the lowermost ceramic sheet of the module so as to close the bottom end of the well created by superposed through-holes, said abutment being formed by silk-screening at the same time as the internal metallization of the holes. A nail-shaped connection pin (designed to provide adequate bonding) is then inserted therein and brazed. However, this technique does not readily lend itself to automatization as such pins are difficult to work (see, for example, the article entitled "Introducing Nail-Shaped Pins in a Pinning Jig" in IBM Technical Disclosure Bulletin, Vol. 16, No. 1, June 1973, page 243). Furthermore, the resultant structures are seldom reliable, due to the fact that the problems associated with the bonding of the nail-shaped pins to the monolithic structure and their centering in accordance with a desired pattern have not yet been fully solved. In addition, said structures have proved very sensitive to corrosion. A similar technique wherein nail-shaped pins are soldered to the structure using a Pb-Sn solder is described in the article entitled "Chip Joining Technique Applied to a Multilayer Circuit Module" in IBM Technical Disclosure Bulletin, Vol. 15, No. 7, December 1972, page 2052, FIG. 1.

Figure 2A:
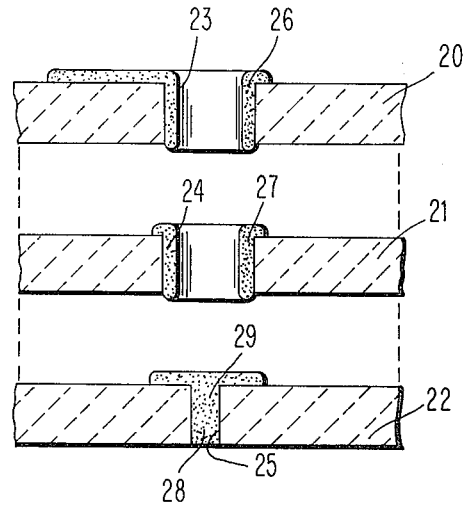
FIGS. 2A–2D illustrate the method of attaching connection pins to the base of a multilayer ceramic module using cavities coated with a thin metallization layer.

The present invention provides a means of reverting to the use of cylindrical connection pins, which are easier to work and the attachment of which to a module can readily be automatized using conventional equipment. FIG. 2A illustrates three green ceramic sheets 20, 21, 22 that include through-holes 23, 24 and 25, respectively. Sheets 20 and 21 are identical with the sheet 10 shown in FIG. 1D and have been metallized in accordance with the method of the present invention, the inner surfaces of holes 23 and 24 being coated with thin layers, labeled 26 and 27, respectively, of the molybdenum paste previously mentioned. On the other hand, a conventional technique has been utilized to metallize sheet 22, using the same molybdenum paste, so that through-hole 25 is completely filled with said paste, as shown at 28, which forms an abutment 29 that will support a cylindrical connection pin. For the purposes of the specific application described hereafter, through-holes 23 and 24 are larger than through-hole 25. For clarity, FIG. 2A shows only two sheets overlying sheet 22, but it will be readily apparent to those skilled in the art that no limitation is implied thereby.

Then, during a second silk-screening step, a cellulose paste is used to fill holes 23 and 24 to prevent sealing thereof during lamination. Since this paste is applied while sheets 20 and 21 are resting on their respective carriers 11 (not shown in FIG. 2A), the cellulose will not be absorbed. Generally, a graphite paste or any other composition that will be burned off during sintering can be used in lieu of said cellulose paste.

Figure 2B:
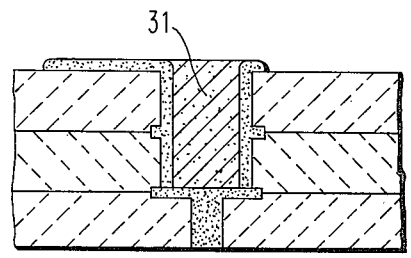
Figure 2C:
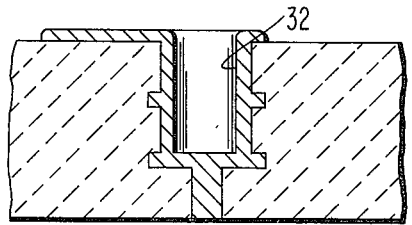
Figure 2D:
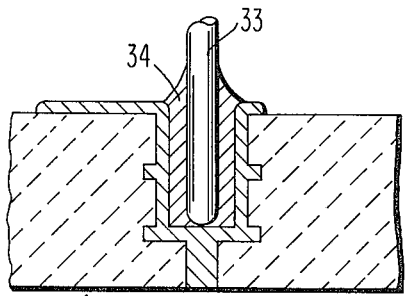

Sheets 20, 21, 22 are then aligned and stacked together in conventional fashion. The resultant structure 30 is illustrated in FIG. 2B, the cellulose paste being shown at 31. Structure 30 is then laminated and sintered in the manner described earlier. During sintering, the cellulose paste is burned off and holes 23, 24 from a single cavity 32 into which a cylindrical connection pin will later be inserted. The resultant monolithic structure is shown in FIG. 2C. During a final step (FIG. 2D), a cylindrical pin 33, made of chromium-plated copper or preferably of Kovar, is inserted into cavity 32, centered, and then brazed using a suitable material shown at 34 such as Incusil (an alloy of copper, silver and indium manufactured by the Indium Corporation of America). The bond will be even better if a thin (approx. 3 microns) layer of nickel is first deposited on the molybdenum which lines the surface of the cavity.

All that remains to be done at this point is to turn the module upside down so that the free ends of the pins will be oriented downwards, to attach the semiconductor chips onto the upper surface of the module and to install a protective cap thereon.

From the foregoing, it is seen that, in comparison with conventional techniques for fabricating multilayer ceramic modules, the present invention requires but one additional step, namely, the filling of the through-holes with the cellulose paste. To some extent, however, this disadvantage could be offset by the fact that the masks utilized to deposit the conductive paste can also be used to deposit the cellulose paste. Furthermore, the additional step is fully compatible with the lamination and sintering steps. Lastly, the invention makes it considerably easier to attach the connection pins and increases the reliability thereof.

While the invention has been particularly shown and described with reference to a preferred embodiment thereof, it will be understood by those skilled in the art that the foregoing and other changes in form and detail may be made therein without departing from the spirit and scope of the invention.

What is claimed is:

1. A method of metallizing the surface of through-holes in an insulating sheet comprising the steps of:
   a. placing said sheet onto an absorbent carrier;
   b. filling said through-holes with a metallization paste containing a metal component dispersed in an organic solvent, which solvent is absorbable by said carrier;
   c. stripping said sheet from said carrier such that the center part of said paste which fills said through-holes adheres to and is removed along with the carrier to leave a thin layer of paste on the inner surface of said through-holes; and
   d. heating said sheet to convert said paste to the metal state.

2. In a method of metallizing the inner surface of a through-hole punched in a green ceramic sheet, in which the metallization is formed using a screening paste comprising a metal component in dispersion in an organic vehicle which includes a solvent component, the steps of:
   a. applying a green ceramic sheet, into which at least one through-hole has been punched, onto a carrier which is capable of absorbing the solvent component of said vehicle,
   b. applying a screening mask including an opening corresponding to said through-hole onto said sheet,
   c. filling said through-hole with said paste through said mask,
   d. removing said mask, and
   e. stripping said ceramic sheet from said carrier, such that the center part of said paste which fills said through-hole adheres to and is removed along with the carrier to leave a thin layer of paste on the inner surface of said through-hole.

3. Method in accordance with claim 2, wherein said mask includes further openings for forming surface conductors on said sheet by the screening of said paste.

4. Method in accordance with claim 3, wherein said paste is a mixture of powdered molybdenum (70%) and a glass frit (30%), and of an organic vehicle comprised of butyl carbitol acetate (75%), ethyl cellulose (20%), and N-acylated sarcosine, (5%).

5. Method in accordance with claim 4 wherein said carrier consists of paper, which material is highly absorbent with respect to the butyl carbitol acetate.

6. The method of claim 2 including the steps of:
   a. forming a plurality of sheets having through-holes coated with screening paste.
   b. filling said through-holes with an organic paste capable of being volatilized during a subsequent sintering step,
   c. aligning and stacking said sheets together such that the through-holes are aligned at desired locations, and
   d. laminating and sintering the aligned and stacked sheets to volatilize said organic paste, densify the ceramic and fire said screening paste, thereby forming a multilayer module having a cavity the inner surface of which is metallized and which can accommodate a connection pin.

7. The method of claim 6 wherein said organic paste is a cellulose paste.

8. The method of claim 6 in which prior to step (d), at least one green ceramic sheet is added to said stacked sheets which sheet includes a through-hole which is metallized by means of a conventional technique and the diameter of which is smaller than that of the holes forming said cavity, so as to close one end of said cavity.

9. The method of claim 8 wherein said green ceramic sheet which includes a through-hole which is metallized by means of a conventional technique is further provided with a metal abutment intended to support the base of a connection pin.

10. Method of claim 9 wherein a connection pin is bonded to the cavity thus formed in order to complete said module.

11. Method of claim 10 wherein said connection pin is brazed using a metal.

* * * * *